US012642040B2

(12) United States Patent
Yadani

(10) Patent No.:  US 12,642,040 B2
(45) Date of Patent:      May 26, 2026

(54) SEMICONDUCTOR MANUFACTURING APPARATUS AND METHOD OF MANUFACTURING SEMICONDUCTOR DEVICE

(71) Applicant: Mitsubishi Electric Corporation, Tokyo (JP)

(72) Inventor: Yusuke Yadani, Tokyo (JP)

(73) Assignee: Mitsubishi Electric Corporation, Tokyo (JP)

( * ) Notice:    Subject to any disclaimer, the term of this patent is extended or adjusted under 35 U.S.C. 154(b) by 0 days.

(21) Appl. No.: 18/529,434

(22) Filed:    Dec. 5, 2023

(65) Prior Publication Data

US 2024/0105472 A1      Mar. 28, 2024

Related U.S. Application Data

(62) Division of application No. 18/047,590, filed on Oct. 18, 2022, now Pat. No. 11,929,265.

(30) Foreign Application Priority Data

Dec. 21, 2021    (JP) .................................. 2021-206758

(51) Int. Cl.
*B23K 20/00*          (2006.01)
*B23K 20/10*          (2006.01)
(Continued)

(52) U.S. Cl.
CPC ........ *H01L 21/67092* (2013.01); *B23K 20/10* (2013.01); *B23K 20/106* (2013.01); *H01L 21/607* (2021.08)

(58) Field of Classification Search
CPC ............. H01L 21/67092; H01L 21/607; H01L 2224/84205; H01L 24/80; H01L 21/67138;
(Continued)

(56) References Cited

U.S. PATENT DOCUMENTS 3,639,969 A      2/1972  Potin et al.
3,934,783 A      1/1976  Larrison
(Continued)

FOREIGN PATENT DOCUMENTS

CN          105189088 A      12/2015
CN          109202259 A      1/2019
(Continued)

OTHER PUBLICATIONS

An Office Action; "Notice of Reasons for Refusal," mailed by the Japanese Patent Office on Jul. 30, 2024, which corresponds to Japanese Patent Application No. 2021-206758 and is related to U.S. Appl. No. 18/529,434; with English language translation.
(Continued)

*Primary Examiner* — Kiley S Stoner
(74) *Attorney, Agent, or Firm* — Studebaker Brackett PLLC

(57) ABSTRACT

A semiconductor manufacturing apparatus includes a tool performing joining by ultrasonic vibration while applying a load to a metal terminal. The tool includes a plurality of protrusions arranged along the X-axis direction and the Y-axis direction on a pressing surface in a rectangular shape at a tip end portion facing the metal terminal. The intervals between the plurality of protrusions are equal in the X direction of the pressing surface, and are larger on the inner peripheral side than on the outer peripheral side in the Y-axis direction of the pressing surface.

9 Claims, 10 Drawing Sheets

(51) Int. Cl.
    *H01L 21/607*      (2006.01)
    *H01L 21/67*      (2006.01)

(58) Field of Classification Search
    CPC .... H01L 24/11; H01L 24/13; H01L 2224/111;
                H01L 2224/13023; B23K 20/10; B23K
                    20/106; B23K 1/06; B29C 65/08
    USPC .................... 228/1.1, 110.1; 156/73.1–73.6,
                              156/580.1–580.2
    See application file for complete search history.

(56)                References Cited

U.S. PATENT DOCUMENTS

| | | | |
|---|---|---|---|
| 4,776,509 | A | 10/1988 | Pitts et al. |
| 5,153,981 | A | 10/1992 | Soto |
| 5,180,093 | A | 1/1993 | Stansbury et al. |
| 5,390,844 | A | 2/1995 | Distefano et al. |
| 5,816,472 | A | 10/1998 | Linn |
| 5,868,301 | A | 2/1999 | Distefano et al. |
| 6,089,438 | A | 7/2000 | Suzuki et al. |
| 6,523,732 | B1 | 2/2003 | Popoola et al. |
| 6,562,166 | B2 | 5/2003 | Molander et al. |
| 7,337,938 | B2 | 3/2008 | Noro |
| 7,793,815 | B2 * | 9/2010 | Shimizu .............. B29C 66/8322 |
| | | | 228/110.1 |
| 7,909,228 | B2 | 3/2011 | Delsman et al. |
| 8,820,609 | B2 | 9/2014 | Walker |
| 9,259,799 | B2 | 2/2016 | Kim et al. |
| 9,458,629 | B2 | 10/2016 | Bauer et al. |
| 9,496,670 | B2 | 11/2016 | Wagner et al. |
| 9,981,336 | B2 | 5/2018 | Poncelet et al. |
| 10,744,591 | B2 | 8/2020 | Miyashiro et al. |
| 10,864,597 | B2 | 12/2020 | Yoshida et al. |
| 10,946,475 | B2 | 3/2021 | Ichinose et al. |
| 10,981,245 | B2 | 4/2021 | Wang et al. |
| 12,179,281 | B2 * | 12/2024 | Buchty ................ B23K 20/106 |
| 2004/0020580 | A1 | 2/2004 | Oishi et al. |
| 2006/0065697 | A1 | 3/2006 | Kobae et al. |
| 2006/0118932 | A1 | 6/2006 | Nanba et al. |
| 2006/0163315 | A1 * | 7/2006 | Delsman ................. H01L 24/48 |
| | | | 228/1.1 |
| 2006/0180635 | A1 | 8/2006 | Lim et al. |
| 2009/0209065 | A1 | 8/2009 | Nishiuchi et al. |
| 2011/0166494 | A1 | 7/2011 | Calvez et al. |
| 2011/0248069 | A1 | 10/2011 | Khakhalev et al. |
| 2011/0290859 | A1 | 12/2011 | Delsman et al. |
| 2013/0139955 | A1 | 6/2013 | Regenberg et al. |
| 2013/0213552 | A1 | 8/2013 | Kelch et al. |
| 2014/0087245 | A1 | 3/2014 | Lee et al. |
| 2015/0090405 | A1 | 4/2015 | Hull |
| 2015/0288123 | A1 | 10/2015 | Wagner et al. |
| 2015/0290873 | A1 | 10/2015 | Hull |
| 2018/0369953 | A1 | 12/2018 | Miyashiro et al. |
| 2019/0287940 | A1 | 9/2019 | Delsman et al. |
| 2020/0343518 | A1 * | 10/2020 | Yamamoto ......... H01M 50/557 |
| 2022/0048129 | A1 | 2/2022 | Böhm et al. |
| 2024/0383065 | A1 * | 11/2024 | Huang ................. B23K 20/106 |
| 2025/0135494 | A1 * | 5/2025 | Nabeta ................. B23K 20/106 |

FOREIGN PATENT DOCUMENTS

| | | | | |
|---|---|---|---|---|
| CN | 109317813 | A * | 2/2019 | ............. B23K 20/26 |
| CN | 107685189 | B * | 7/2020 | .......... B23K 20/004 |
| CN | 112046010 | A * | 12/2020 | |
| CN | 113351981 | A * | 9/2021 | |
| CN | 113787251 | A | 12/2021 | |
| CN | 119927404 | A * | 5/2025 | .......... H01M 50/593 |
| DE | 10 2006 025 866 | A1 | 12/2007 | |
| DE | 102018123119 | A1 | 3/2020 | |
| DE | 102024130777 | A1 * | 4/2025 | ............... B06B 3/00 |
| EP | 3626475 | A2 * | 3/2020 | ............. B42D 25/45 |
| JP | 2006231402 | A * | 9/2006 | ........ B29C 66/81435 |
| JP | 2006264835 | A * | 10/2006 | ......... B29C 66/1122 |
| JP | 2010-274296 | A | 12/2010 | |
| JP | 2014-179435 | A | 9/2014 | |
| JP | 2014-213366 | A | 11/2014 | |
| KR | 20060087419 | A * | 8/2006 | ............. B23K 20/10 |
| KR | 10-2014-0022690 | A | 2/2014 | |
| KR | 10-2015-0038930 | A | 4/2015 | |
| KR | 20170009297 | A * | 1/2017 | ............. B23K 20/10 |
| KR | 10-2020-0090498 | A | 7/2020 | |
| WO | 2018/025362 | A1 | 2/2018 | |
| WO | WO-2024136616 | A1 * | 6/2024 | .......... H01M 50/538 |

OTHER PUBLICATIONS

Office Action issued in DE 10 2022 130 668.2; mailed by the German Patent and Trademark Office on May 6, 2025.

* cited by examiner

F I G. 3A
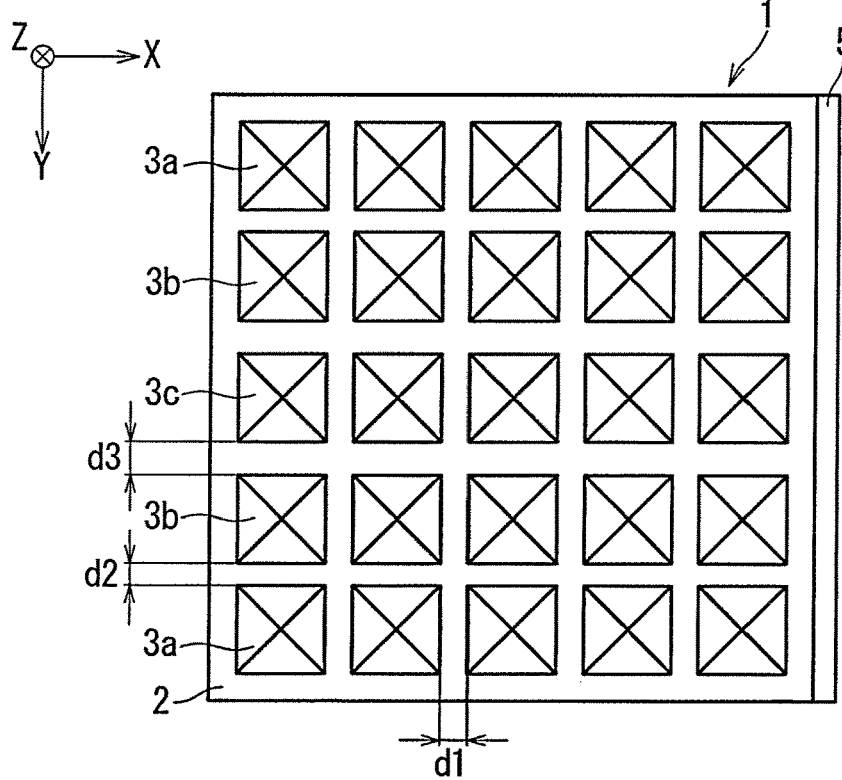
F I G. 3B
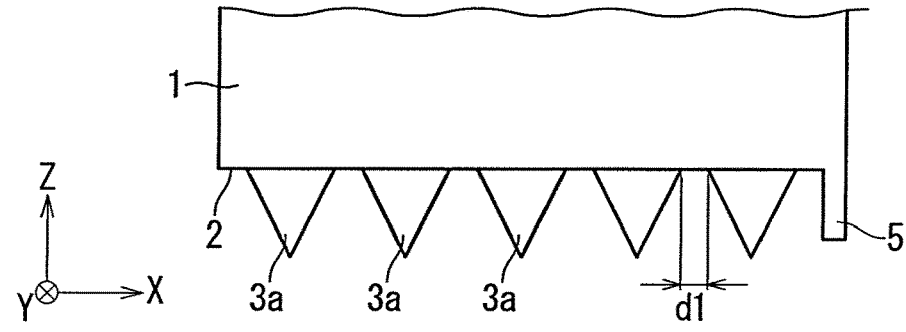
F I G. 3C
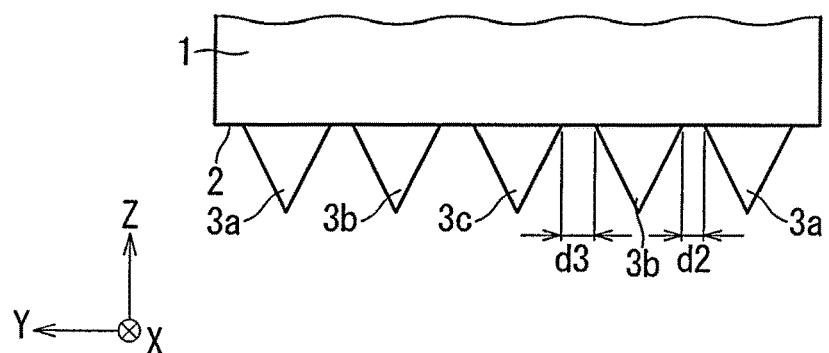

F I G. 6 A
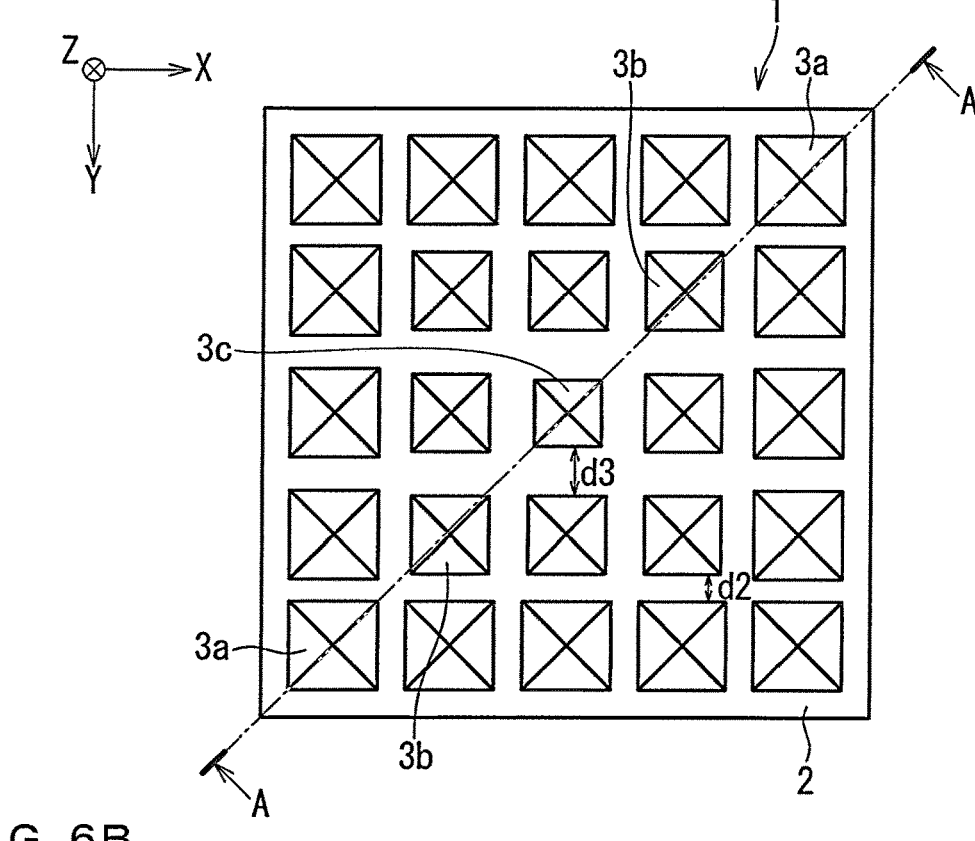
F I G. 6 B
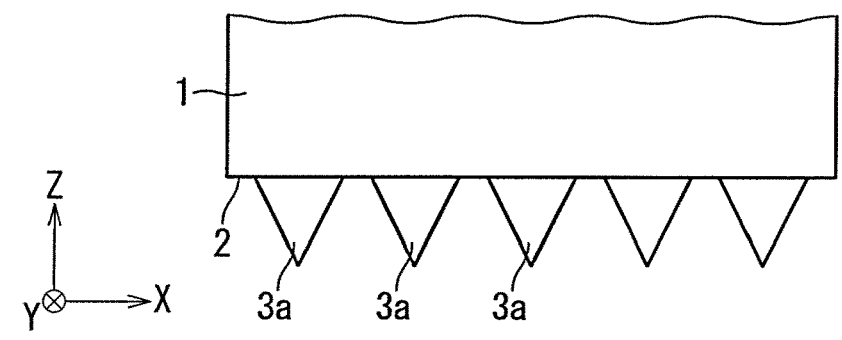
F I G. 6 C
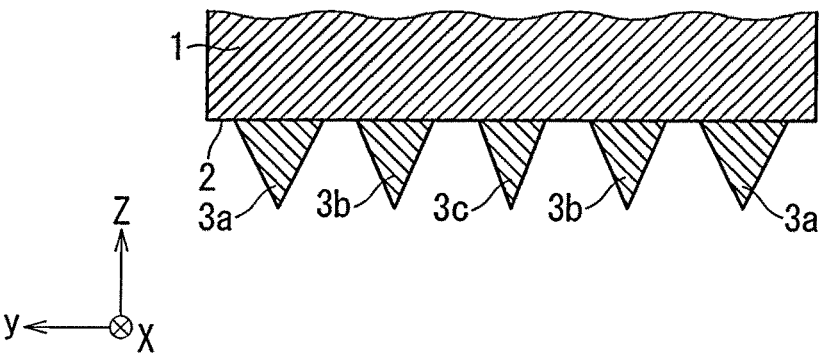

F I G. 7
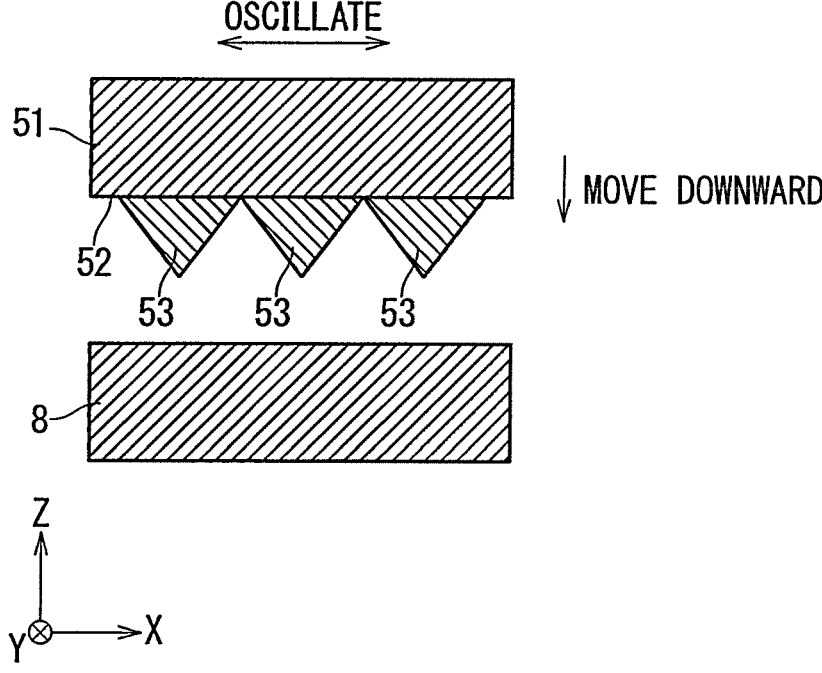

SEMICONDUCTOR MANUFACTURING APPARATUS AND METHOD OF MANUFACTURING SEMICONDUCTOR DEVICE

CROSS-REFERENCE TO RELATED APPLICATIONS

This application is a Divisional of U.S. patent application Ser. No. 18/047,590, filed Oct. 18, 2022, which claims benefit of priority to Japanese Patent Application No. 2021-206758, filed Dec. 21, 2021, the entire contents of which are incorporated herein by reference.

BACKGROUND OF THE INVENTION

Field of the Invention

The present disclosure relates to a semiconductor manufacturing apparatus and a method of manufacturing a semiconductor device.

Description of the Background Art

Conventionally, ultrasonic bonding has been used for joining an object to be joined such as a metal terminal of a semiconductor device. Ultrasonic bonding is a method of performing joining by ultrasonic vibration while applying a load to an object to be joined using a tool.

For example, Japanese Patent Application Laid-Open No. 2014-179435 discloses an ultrasonic bonding apparatus in which a plurality of protrusions, having a shape in which the width becomes narrower toward the tip end, is provided on a pressing surface which is a tip end portion of a tool, the tool is oscillated by ultrasonic vibration, and the plurality of protrusions press a metal terminal to perform metal bonding.

However, in the ultrasonic bonding apparatus described in Japanese Patent Application Laid-Open No. 2014-179435, when the tool comes into contact with the metal terminal, the metal constituting the metal terminal is discharged, and a whisker is generated. When the protrusion at the tip of the tool is deeply pressed against the metal terminal, the whisker with no space remaining between the adjacent protrusions spreads toward the wide space on the outer peripheral side of the pressing surface. Therefore, it is not easy to remove the whiskers.

SUMMARY

An object of the present disclosure is to provide a technique capable of easily performing a removal operation of whiskers.

A semiconductor manufacturing apparatus according to the present disclosure includes a tool performing joining by ultrasonic vibration while applying a load to a metal terminal.

The tool includes a plurality of protrusions arranged along a first direction and a second direction that is a direction intersecting the first direction on a pressing surface in a rectangular shape at a tip end portion facing the metal terminal.

The intervals between the plurality of protrusions are equal in the first direction of the pressing surface, and are larger on the inner peripheral side than on the outer peripheral side in the second direction of the pressing surface.

Since the inner peripheral side is larger than the outer peripheral side in the second direction of the pressing surface, a whisker generated at the time of joining easily spreads in the first direction along the inner peripheral side in second direction of the pressing surface.

As a result, since the generation direction of the whisker can be limited, the removal operation of the whisker can be easily performed.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 3A to 3C are a bottom view and side views of a tool included in a semiconductor manufacturing apparatus according to a second preferred embodiment;

FIGS. 6A to 6C are a bottom view, a side view, and a cross-sectional view taken along a line A-A, of a tool included in a semiconductor manufacturing apparatus according to a fifth preferred embodiment;

FIG. 7 is a cross-sectional view illustrating a state before a metal terminal is pressed by a tool included in a semiconductor manufacturing apparatus according to related art;

DESCRIPTION OF THE PREFERRED EMBODIMENTS

Related Art

Figure 8A:
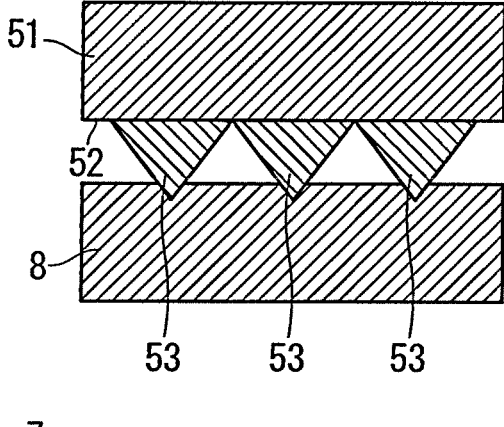
FIGS. 8A and 8B are a cross-sectional view and a bottom view illustrating a state where a tool included in the semiconductor manufacturing apparatus according to related art is in contact with a metal terminal.
Figure 8B:
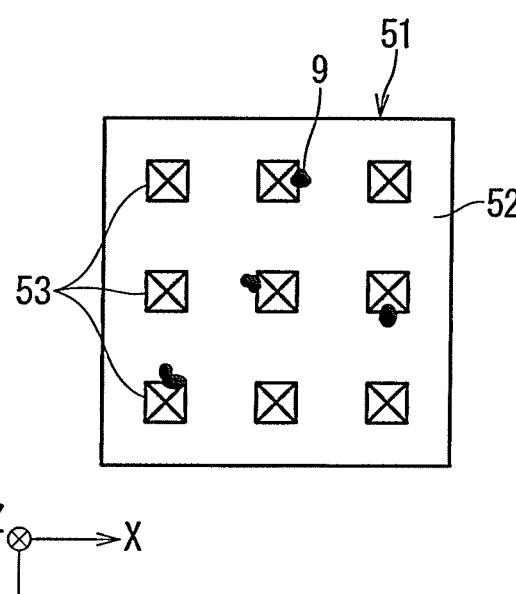
Figure 9A:
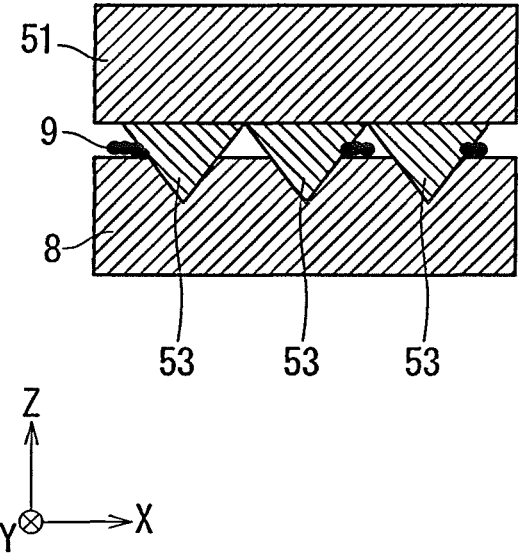
FIGS. 9A and 9B are a cross-sectional view and a bottom view illustrating a state where a metal terminal is pressed by a tool included in the semiconductor manufacturing apparatus according to related art.
Figure 9B:
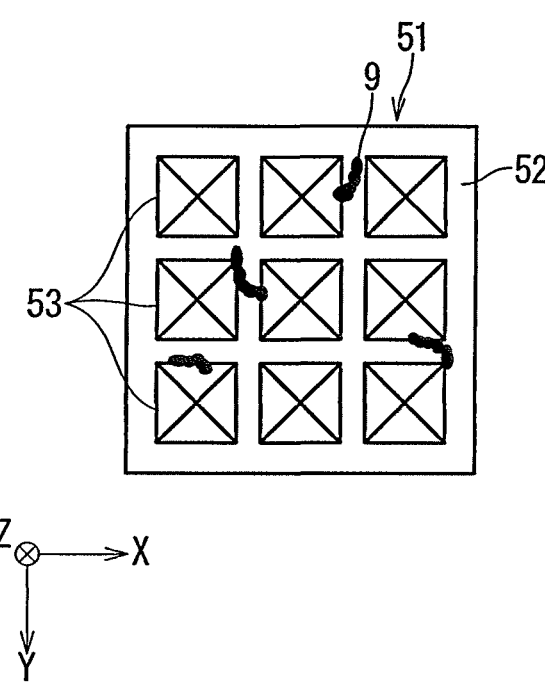
Figure 10A:
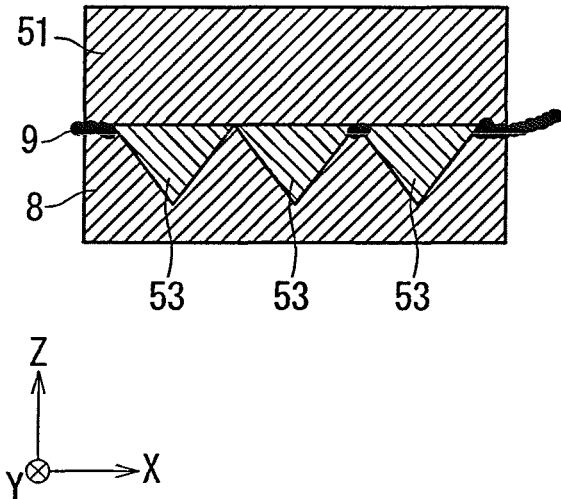
FIGS. 10A and 10B are a cross-sectional view and a bottom view illustrating a state where a metal terminal is deeply pressed by a tool included in the semiconductor manufacturing apparatus according to related art.
Figure 10B:
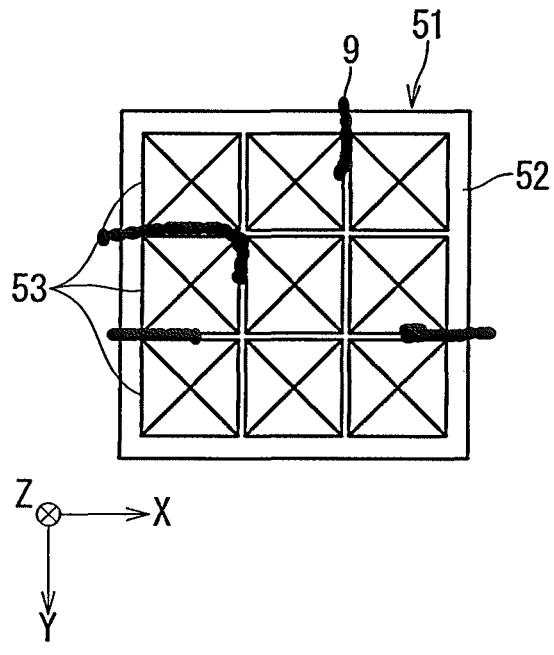

First, related art of a preferred embodiment will be described. FIG. 7 is a cross-sectional view illustrating a state before a metal terminal 8 is pressed by a tool 51 included in a semiconductor manufacturing apparatus according to related art. FIG. 8A is a cross-sectional view illustrating a state where the tool 51 is in contact with the metal terminal 8. FIG. 8B is a bottom view of the tool 51 illustrating a state where the tool 51 is in contact with the metal terminal 8. FIG. 9A is a cross-sectional view illustrating a state where the metal terminal 8 is pressed by the tool 51. FIG. 9B is a bottom view of the tool 51 illustrating a state where the metal terminal 8 is pressed by the tool 51. FIG. 10A is a cross-sectional view illustrating a state where the metal terminal 8 is deeply pressed by the tool 51. FIG. 10B is a bottom view of the tool 51 illustrating a state where the metal terminal 8 is deeply pressed by the tool 51.

In FIG. 7, an X direction, a Y direction, and a Z direction are orthogonal to each other. The X direction, the Y direction, and the Z direction illustrated in the following drawings are also orthogonal to each other. Hereinafter, a direction including the X direction and a –X direction which is a direction opposite to the X direction is also referred to as an "X-axis direction". In addition, a direction including the Y direction and a –Y direction which is a direction opposite to the Y direction is also referred to as a "Y-axis direction". In addition, a direction including the Z direction and a –Z direction which is a direction opposite to the Z direction is also referred to as a "Z-axis direction".

As illustrated in FIG. 7, the semiconductor manufacturing apparatus according to the related art includes the tool 51 performing joining by ultrasonic vibration while applying a load to the metal terminal 8 of a semiconductor device (not illustrated). A pressing surface 52 is formed at a tip end portion of the tool 51 facing the metal terminal 8. The pressing surface 52 is provided with a plurality of quadrangular pyramid-shaped protrusions 53 whose widths become narrower toward the tip end, and the tool 51 moves downward (–Z direction) in a state of being oscillated in the X-axis direction by ultrasonic vibration, and the plurality of protrusions 53 press the metal terminal 8 to perform metal bonding.

As illustrated in FIGS. 8A and 8B, when the tool 51 comes into contact with the metal terminal 8, the metal constituting the metal terminal 8 is discharged, and a whisker 9 is generated. As illustrated in FIGS. 9A and 9B, when the tool 51 presses the metal terminal 8, and further, as illustrated in FIGS. 10A and 10B, when the tool 51 presses the metal terminal 8 deeply, the whisker 9 with no space remaining between the adjacent protrusions 53 spreads toward a wide space on the outer peripheral side of the pressing surface 52. Therefore, it is not easy to remove the whiskers 9. The preferred embodiment has been made to solve such a problem, and will be described in detail below.

First Preferred Embodiment

Figure 1A:
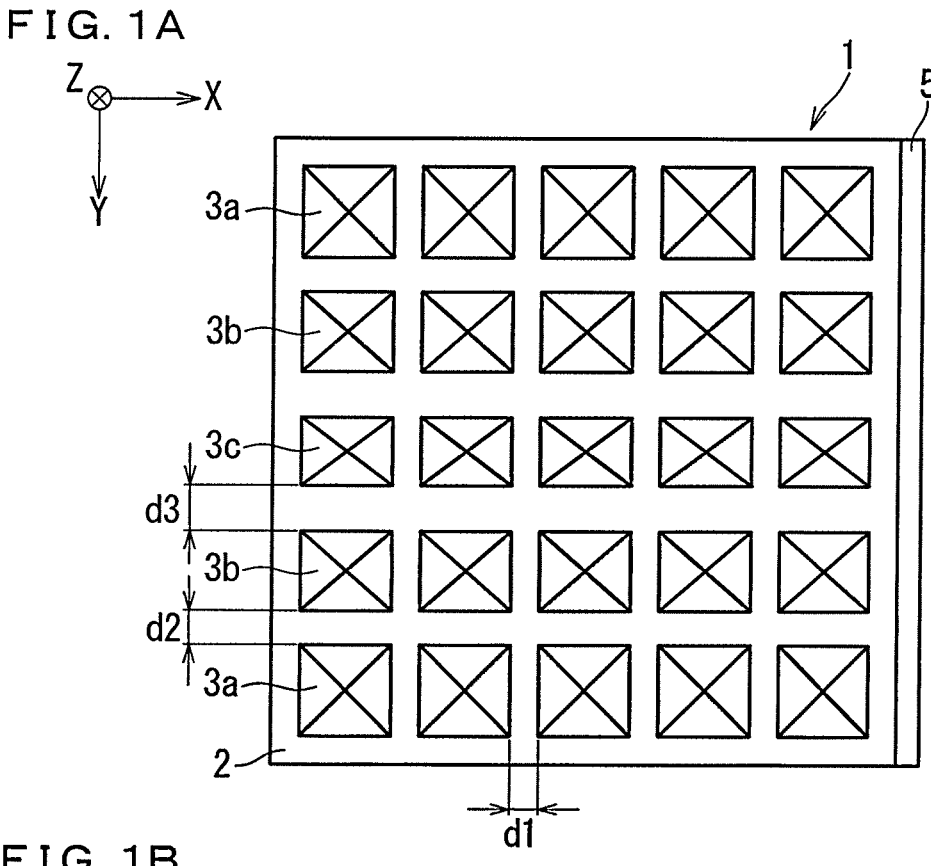
FIGS. 1A to 1C are a bottom view and side views of a tool included in a semiconductor manufacturing apparatus according to a first preferred embodiment.
Figure 1B:
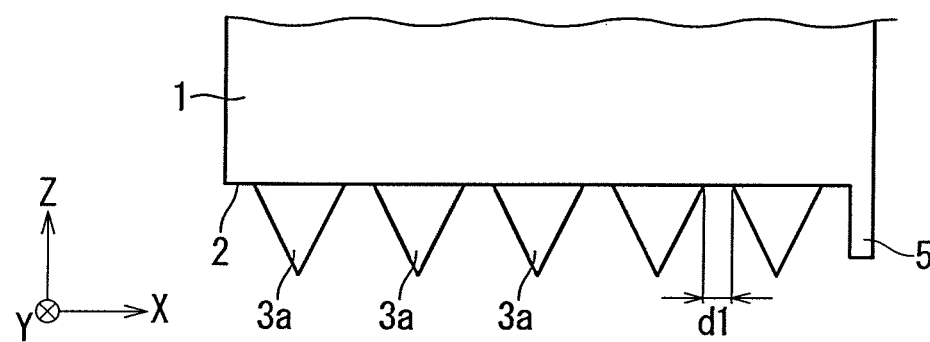
Figure 1C:
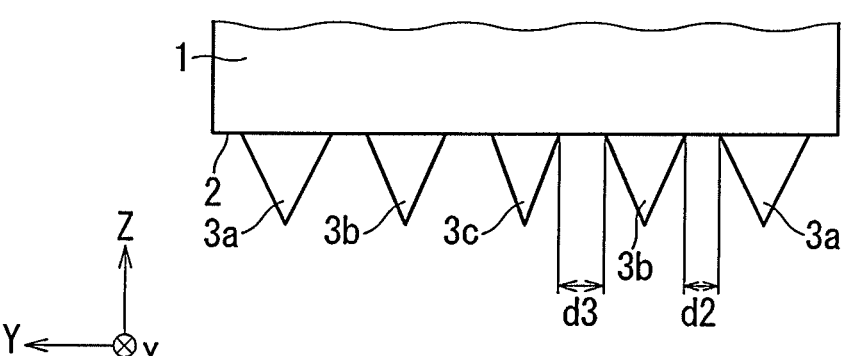
Figure 2:
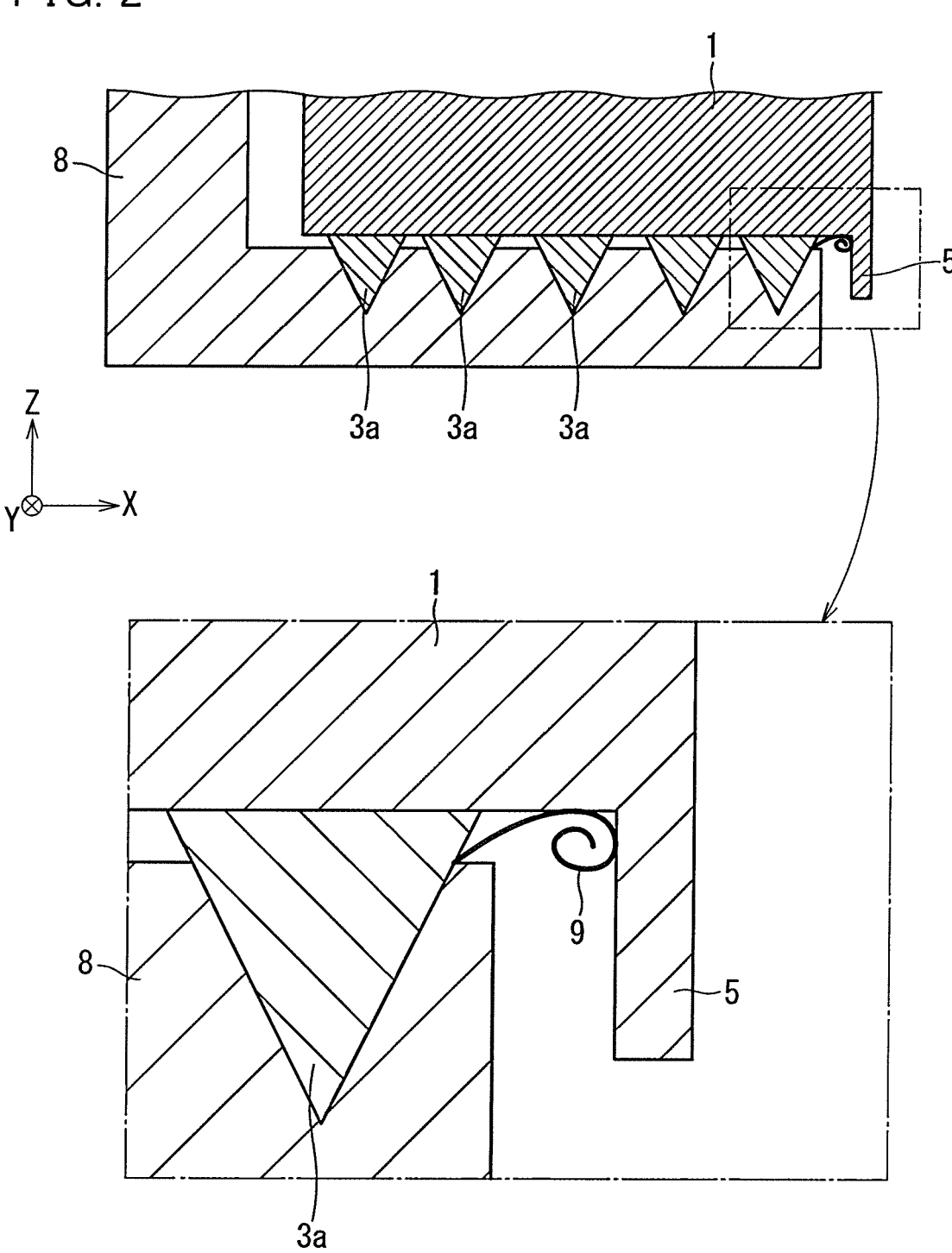
FIG. 2 is a cross-sectional view and an enlarged view of a main part illustrating a state where a metal terminal is pressed by a tool included in the semiconductor manufacturing apparatus according to the first preferred embodiment.

A first preferred embodiment will be described below with reference to the drawings. FIG. 1A is a bottom view of a tool 1 included in a semiconductor manufacturing apparatus according to the first preferred embodiment. FIGS. 1B and 1C are side views of the tool 1. FIG. 2 is a cross-sectional view and an enlarged view of a main part illustrating a state where the metal terminal 8 is pressed by the tool 1.

As illustrated in FIGS. 1A, 1B, and 1C, the semiconductor manufacturing apparatus according to the first preferred embodiment includes the tool 1 that performs bonding by ultrasonic vibration while applying a load to the metal terminal 8 of a semiconductor device (not illustrated).

The tool 1 includes a plurality of quadrangular pyramidal protrusions 3a, 3b, and 3c. A pressing surface 2 in a rectangular shape is formed at a tip end portion of the tool 1 facing the metal terminal 8. The plurality of protrusions 3a, 3b, and 3c are arranged along the X-axis direction and the Y-axis direction of the pressing surface 2. Specifically, the plurality of protrusions 3a, 3b, and 3c are arranged in five rows in the X-axis direction and five rows in the Y-axis direction.

Five rows of the protrusions 3c are arranged along the X-axis direction at a center portion of the pressing surface 2 in the Y-axis direction. Five rows of the protrusions 3b are arranged along the X-axis direction on the outer peripheral side in the Y-axis direction from the protrusions 3c on the pressing surface 2. Five rows of the protrusions 3a are arranged along the X-axis direction on the outer peripheral side in the Y-axis direction from the protrusions 3b on the pressing surface 2.

The shape of the protrusions 3a, 3b, and 3c may not be a quadrangular pyramid but may be, for example, a conical shape or a hexagonal pyramid shape. Here, the X-axis direction corresponds to a first direction, and the Y-axis direction corresponds to a second direction that is a direction intersecting the first direction.

The protrusions 3a, 3b, and 3c are spaced at equal intervals in the X-axis direction of the pressing surface 2. The interval between the protrusions 3a, 3b, and 3c is larger on the inner peripheral side than on the outer peripheral side in the Y-axis direction of the pressing surface 2. Specifically, an interval d1 between the protrusion 3a and the adjacent protrusion 3a, the interval d1 between the protrusion 3b and the adjacent protrusion 3b, and the interval d1 between the protrusion 3c and the adjacent protrusion 3c are the same. An interval d3 between the protrusion 3c and the protrusion 3b adjacent to each other in the Y-axis direction is larger than an interval d2 between the protrusion 3b and the protrusion 3a adjacent to each other in the Y-axis direction. Further, the interval d2 is larger than the interval d1. Here, the inner peripheral side of the pressing surface 2 in the Y-axis direction is the center side of the pressing surface 2 in the Y-axis direction.

The width of the protrusion 3a in the Y-axis direction is larger than the width of the protrusion 3b on the inner peripheral side in the Y-axis direction. The width of the protrusion 3b in the Y-axis direction is larger than the width of the protrusion 3c on the inner peripheral side in the Y-axis direction. In addition, the widths of the protrusions 3a, 3b, and 3c in the X-axis direction are the same, and the apexes of the protrusions 3a, 3b, and 3c are also at the same height position.

Since the interval d3 is larger than the interval d2, the whisker 9 (see FIG. 2) generated at the time of joining easily spread in the X-axis direction along the inner peripheral side in the Y-axis direction of the pressing surface 2. Since the generation direction of the whisker 9 can be limited, the removal operation of the whisker 9 can be easily performed.

As illustrated in FIGS. 1A to 1C, and 2, a protruding portion 5 protruding toward the metal terminal 8 side is provided at an end portion in the X direction (one end portion in the X axis direction) of the pressing surface 2 across the end portion in the X direction. The height position of the protruding portion 5 is higher than the height position of the apexes of the protrusions 3a, 3b, and 3c. The protruding portion 5 can block the whisker 9 spreading in the X direction.

As described above, the semiconductor manufacturing apparatus according to the first preferred embodiment includes the tool 1 performing joining by ultrasonic vibration while applying a load to the metal terminal 8. The tool 1 includes the plurality of protrusions 3a, 3b, and 3c arranged along the X-axis direction and the Y-axis direction on the pressing surface 2 in the rectangular shape at the tip end portion facing the metal terminal 8. The intervals between the plurality of protrusions 3a, 3b, and 3c are equal in the X-axis direction of the pressing surface 2, and are larger on the inner peripheral side than on the outer peripheral side in the Y-axis direction of the pressing surface 2.

Therefore, since the inner peripheral side is larger than the outer peripheral side in the Y-axis direction of the pressing surface 2, the whisker 9 generated at the time of joining easily spread in the X-axis direction along the inner peripheral side in the Y-axis direction of the pressing surface 2. As a result, since the generation direction of the whisker 9 can be limited, the removal operation of the whisker 9 can be easily performed. As a result, the yield of semiconductor devices manufactured by the semiconductor manufacturing apparatus can be improved.

In addition, since the width of the plurality of protrusions 3a, 3b, and 3c in the Y-axis direction is larger on the outer peripheral side than on the inner peripheral side of the pressing surface 2 in the Y-axis direction, the outer dimension of the tool 1 can be reduced. This makes it possible to effectively perform joining to the thin metal terminal 8.

Further, the protruding portion 5 protruding toward the metal terminal 8 side is provided across one end portion of the pressing surface 2 in the X axis direction. Therefore, since the whisker 9 generated at the time of joining is blocked by the protruding portion 5, it is possible to prevent the whisker 9 from coming into contact with the electrode or the like in the semiconductor device and short-circuiting the electrode or the like.

Second Preferred Embodiment

Next, a semiconductor manufacturing apparatus according to a second preferred embodiment will be described. FIG. 3A is a bottom view of a tool 1 included in a semiconductor manufacturing apparatus according to the second preferred embodiment. FIGS. 3B and 3C are side views of the tool 1. In the second preferred embodiment, the same constituent elements as those described in the first preferred embodiment are denoted by the same reference numerals, and the description thereof will be omitted.

As illustrated in FIGS. 3A, 3B, and 3C, in the second preferred embodiment, the widths of the plurality of protrusions 3a, 3b, and 3c are the same. The relationship among the intervals d1, d2, and d3 is similar to that in the first preferred embodiment. Here, the same width means that the width in the X-axis direction and the width in the Y-axis direction are the same.

As described above, in the semiconductor manufacturing apparatus according to the second preferred embodiment, since the widths of the plurality of protrusions 3a, 3b, and 3c are the same, the generation direction of the whisker 9 can be limited as in the case of the first preferred embodiment, so that the operation of removing the whisker 9 can be easily performed.

Third Preferred Embodiment

Figure 4A:
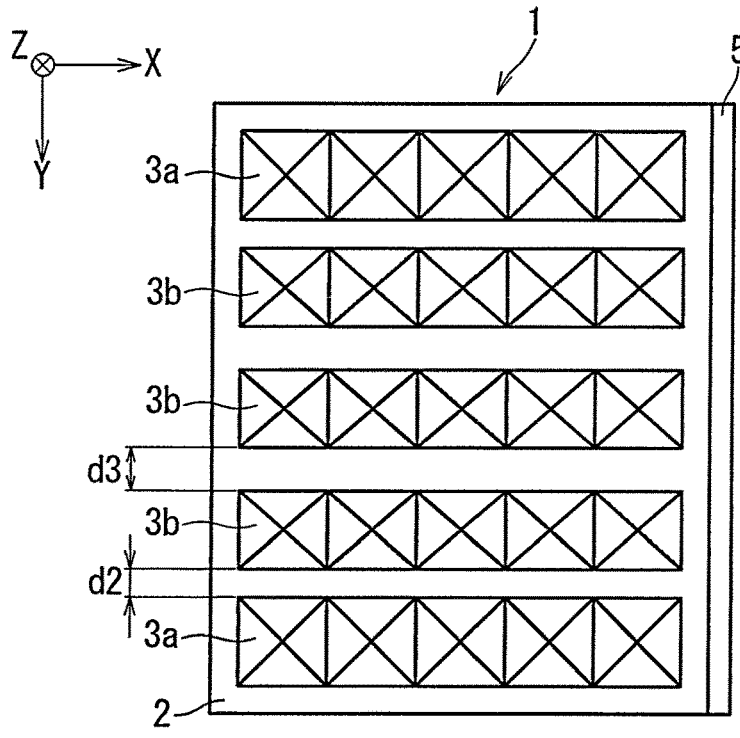
FIGS. 4A to 4C are a bottom view and side views of a tool included in a semiconductor manufacturing apparatus according to a third preferred embodiment.
Figure 4B:
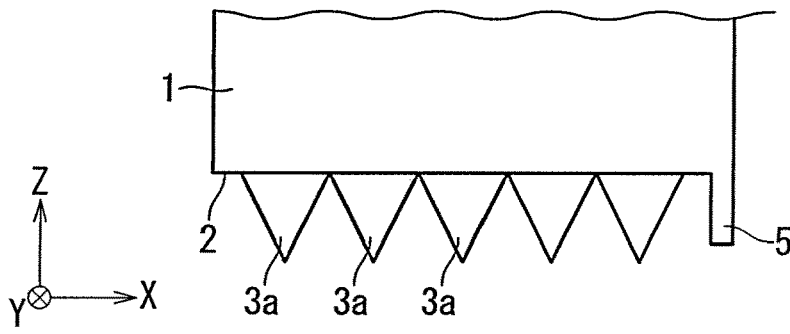
Figure 4C:
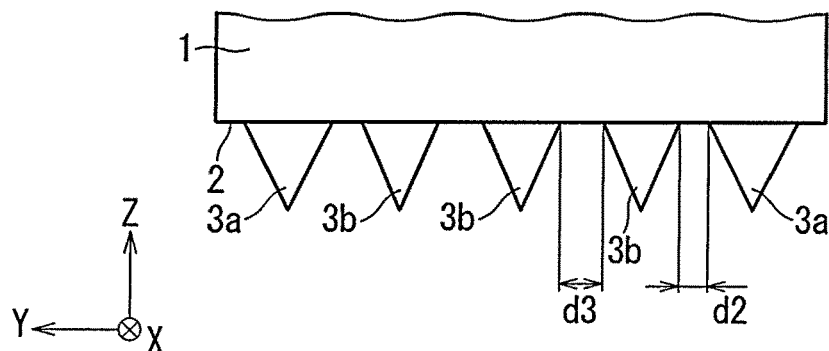

Next, a semiconductor manufacturing apparatus according to a third preferred embodiment will be described. FIG. 4A is a bottom view of a tool 1 included in a semiconductor manufacturing apparatus according to the third preferred embodiment. FIGS. 4B and 4C are side views of the tool 1. In the third preferred embodiment, the same constituent elements as those described in the first and second preferred embodiments are denoted by the same reference numerals, and the description thereof will be omitted.

As illustrated in FIGS. 4A, 4B, and 4C, in the third preferred embodiment, five rows of protrusions 3b are arranged along the X-axis direction at each of the central portion in the Y-axis direction of the pressing surface 2 and the outer peripheral side thereof. Five rows of the protrusions 3a are arranged along the X-axis direction on the outer peripheral side in the Y-axis direction from the protrusions 3b on the pressing surface 2. The plurality of protrusions 3a and 3b are arranged along the X-axis direction of the pressing surface 2 without any interval. The interval d3 between the protrusion 3b and the protrusion 3b adjacent to each other in the Y-axis direction is larger than the interval d2 between the protrusion 3b and the protrusion 3a adjacent to each other in the Y-axis direction.

The width of the protrusion 3a in the Y-axis direction is larger than the width of the protrusion 3b in the Y-axis direction. In addition, the widths of the protrusions 3a and 3b in the X-axis direction are the same, and the apexes of the protrusions 3a and 3b are also at the same height position.

As described above, in the semiconductor manufacturing apparatus according to the third preferred embodiment, since the plurality of protrusions 3a and 3b are arranged along the X-axis direction of the pressing surface 2 without any interval, the generation direction of the whisker 9 can be limited as in the case of the first preferred embodiment, so that the operation of removing the whisker 9 can be easily performed.

Fourth Preferred Embodiment

Figure 5A:
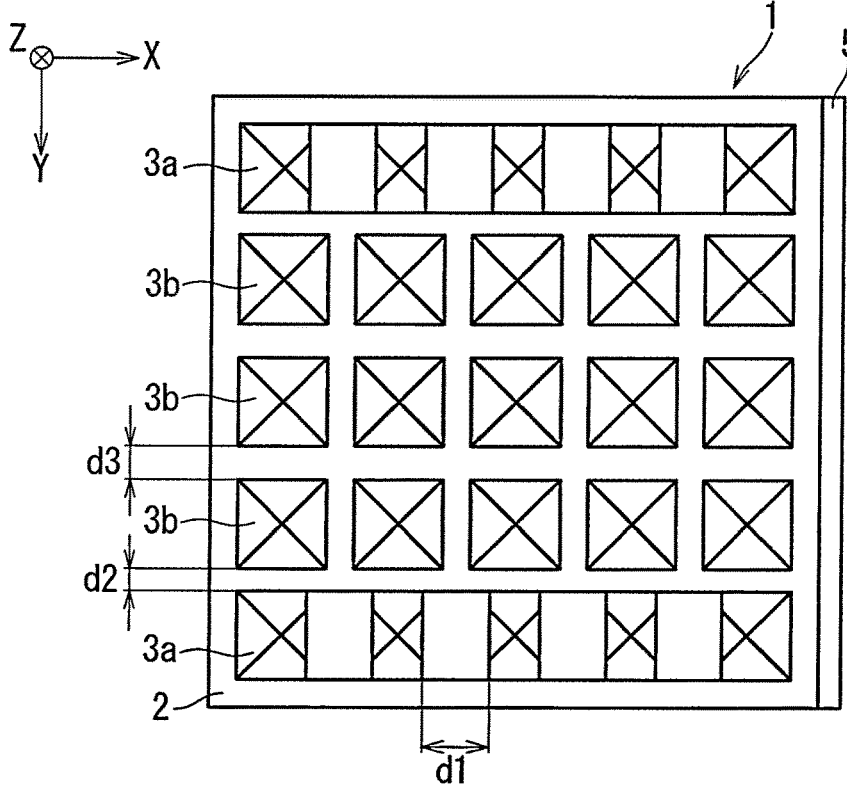
FIGS. 5A to 5C are a bottom view and side views of a tool included in a semiconductor manufacturing apparatus according to a fourth preferred embodiment.
Figure 5B:
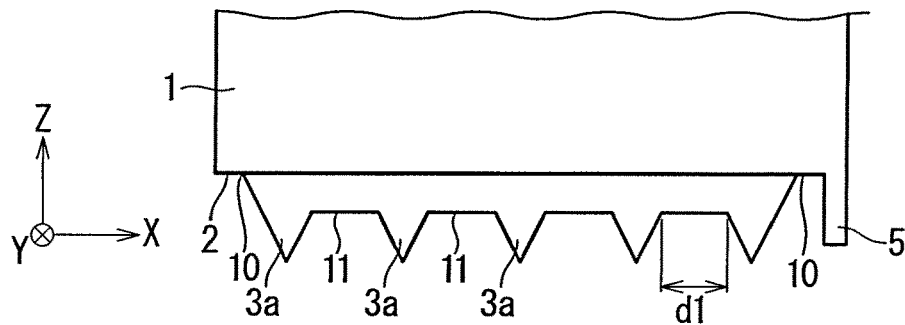
Figure 5C:
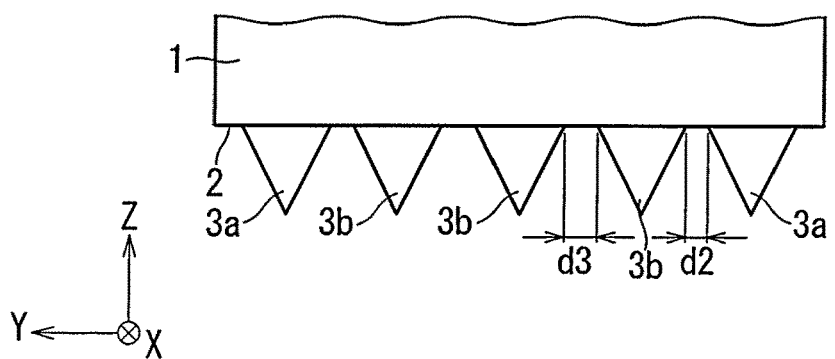

Next, a semiconductor manufacturing apparatus according to a fourth preferred embodiment will be described. FIG. 5A is a bottom view of a tool 1 included in a semiconductor manufacturing apparatus according to the fourth preferred embodiment. FIGS. 5B and 5C are side views of the tool 1. In the fourth preferred embodiment, the same constituent elements as those described in the first to third preferred embodiments are denoted by the same reference numerals, and the description thereof will be omitted.

As illustrated in FIGS. 5A, 5B, and 5C, in the fourth preferred embodiment, five rows of protrusions 3b are arranged along the X-axis direction at each of the central portion in the Y-axis direction of the pressing surface 2 and the outer peripheral side thereof. Five rows of the protrusions 3a are arranged along the X-axis direction on the outer peripheral side in the Y-axis direction from the protrusions 3b on the pressing surface 2. Among the plurality of protrusions 3a provided at both end portions in the Y axis direction of the pressing surface 2, a groove 10 on the outer peripheral side of the protrusions 3a provided at both end portions in the X axis direction of the pressing surface 2 is deeper than a groove 11 between the protrusions 3a provided at portions other than both end portions in the X-axis direction of the pressing surface 2. Since the groove 11 is shallower than the groove 10, a gap between the groove 11 and the metal terminal 8 is filled during joining.

The interval d3 between the protrusion 3b and the protrusion 3b adjacent to each other in the Y-axis direction is larger than the interval d2 between the protrusion 3b and the protrusion 3a adjacent to each other in the Y-axis direction. Further, the interval d1 between the protrusion 3a and the adjacent protrusion 3a is larger than the interval d3.

Further, the width of the protrusion 3a in the Y-axis direction is the same as the width of the protrusion 3b in the Y-axis direction, and the width of the protrusion 3a in the X-axis direction is smaller than the width of the protrusion 3b in the X-axis direction. In addition, the apexes of the protrusions 3a and 3b are at the same height position.

As described above, in the fourth preferred embodiment, among the plurality of protrusions 3a provided at the both end portions in the Y-axis direction of the pressing surface 2, the groove 10 on the outer peripheral side of the protrusion 3a provided at the both end portions in the X axis direction of the pressing surface 2 is deeper than the groove 11 between the protrusions 3a provided at portions other than the both end portions in the X-axis direction of the pressing surface 2. Therefore, since the gap between the groove 11 and the metal terminal 8 is filled at the time of joining, the generation direction of the whisker 9 can be further limited as compared with the case of the first preferred embodiment, and thus the operation of removing the whisker 9 can be more easily performed.

Fifth Preferred Embodiment

Next, a semiconductor manufacturing apparatus according to a fifth preferred embodiment will be described. FIG. 6A is a bottom view of a tool 1 included in a semiconductor manufacturing apparatus according to the fifth preferred embodiment. FIG. 6B is a side view of the tool 1. FIG. 6C is a cross-sectional view taken along line A-A of FIG. 6A. In the fifth preferred embodiment, the same constituent elements as those described in the first to fourth preferred embodiments are denoted by the same reference numerals, and the description thereof will be omitted.

As shown in FIGS. 6A, 6B, and 6C, in the fifth preferred embodiment, the widths of the plurality of protrusions 3a, 3b, and 3c decrease from the outer peripheral side toward the inner peripheral side of the pressing surface 2.

Specifically, one protrusion 3c is arranged at the center portion of the pressing surface 2. On the outer peripheral side of the protrusion 3c on the pressing surface 2, eight protrusions 3b are arranged so as to surround one protrusion 3c. On the outer peripheral side of the eight protrusions 3b on the pressing surface 2, 16 protrusions 3c are arranged so as to surround the eight protrusions 3b. The width of the protrusion 3a is smaller than the width of the protrusion 3b, and the width of the protrusion 3b is smaller than the width of the protrusion 3c.

An interval d3 between the protrusion 3c and the protrusion 3b adjacent to each other in the Y-axis direction is larger than an interval d2 between the protrusion 3b and the protrusion 3a adjacent to each other in the Y-axis direction. In addition, the apexes of the protrusions 3a, 3b, and 3c are at the same height position.

Since the widths of the plurality of protrusions 3a, 3b, and 3c decrease from the outer peripheral side toward the inner peripheral side of the pressing surface 2, the generation direction of the whisker 9 can be limited to the inner peripheral side of the pressing surface 2. Therefore, the protruding portion 5 is not provided at the end portion of the pressing surface 2 in the X direction.

As described above, the semiconductor manufacturing apparatus according to the fifth preferred embodiment includes the tool 1 performing joining by ultrasonic vibration while applying a load to the metal terminal 8. The tool 1 includes the plurality of protrusions 3a, 3b, and 3c arranged along the X-axis direction and the Y-axis direction on the rectangular pressing surface 2 at the tip end portion facing the metal terminal 8. The widths of the plurality of protrusions 3a, 3b, and 3c are decrease from the outer peripheral side to the inner peripheral side of the pressing surface 2. Therefore, the generation direction of the whisker 9 can be limited to the inner peripheral side of the pressing surface 2. As a result, as in the case of the first preferred embodiment, not only the removal operation of the whisker 9 can be easily performed, but also the removal operation of the whisker 9 may be unnecessary because the whisker 9 remains on the inner peripheral side of the pressing surface 2.

Note that the preferred embodiments can be freely combined, and the preferred embodiments can be appropriately modified or omitted.

While the disclosure has been shown and described in detail, the foregoing description is in all aspects illustrative and not restrictive. It is therefore understood that numerous modifications and variations can be devised.

What is claimed is:

1. A method of manufacturing a semiconductor device, comprising:
   performing joining by ultrasonic vibration while applying a load to a metal terminal with a tool, wherein
   the tool includes a plurality of protrusions arranged on a pressing surface in a rectangular shape at a tip end portion facing the metal terminal along a first direction and a second direction that is a direction intersecting the first direction,
   intervals between the plurality of protrusions are equal in the first direction of the pressing surface,
   along a row of the plurality of protrusions in the second direction, a plurality of intervals between the plurality of protrusions on an inner peripheral side in the second direction are greater than an interval between the plurality of protrusions on an outer peripheral side of the pressing surface in the second direction,
   a protruding portion protruding toward the metal terminal is provided across one end portion of the pressing surface in the first direction, the protruding portion being positioned outside of the metal terminal in the first direction during the joining, and
   the protruding portion is configured to block a whisker from coming into contact with the semiconductor device during the joining.

2. The method according to claim 1, wherein widths of the plurality of protrusions are equal.

3. The method according to claim 1, wherein the plurality of protrusions are directly adjacent to each other along the first direction of the pressing surface.

4. The method according to claim 1, wherein among the plurality of protrusions provided at both end portions in the second direction of the pressing surface, a groove on an outer peripheral side of the protrusions provided at both end portions in the first direction of the pressing surface is deeper than a groove between the protrusions provided at a portion other than the both end portions in the first direction of the pressing surface.

5. The method according to claim 1, wherein along each row of the plurality of protrusions extending in the second direction, the plurality of intervals between the plurality of protrusions on the inner peripheral side in the second direction are greater than the plurality of intervals between the plurality of protrusions on the outer peripheral side of the pressing surface in the second direction.

6. The method according to claim 1, wherein intervals between each of the plurality of protrusions are equal in the first direction.

7. The method according to claim 1, wherein during the joining by ultrasonic vibration while applying the load to the metal terminal with the tool, a whisker is generated from the metal terminal that spreads in the first direction along the inner peripheral side.

8. The method according to claim 1, wherein the protruding portion has a smaller height than the plurality of protrusions measured in a third direction perpendicular to the first direction and the second direction.

9. A method of manufacturing a semiconductor device, comprising:

performing joining by ultrasonic vibration while applying a load to a metal terminal with a tool, wherein the tool includes a plurality of protrusions arranged on a pressing surface in a rectangular shape at a tip end portion facing the metal terminal along a first direction and a second direction that is a direction intersecting the first direction, intervals between the plurality of protrusions are equal in the first direction of the pressing surface, along a row of the plurality of protrusions in the second direction, a plurality of intervals between the plurality of protrusions on an inner peripheral side in the second direction are greater than an interval between the plurality of protrusions on an outer peripheral side of the pressing surface in the second direction, a protruding portion protruding toward the metal terminal is provided across one end portion of the pressing surface in the first direction, the protruding portion being positioned outside of the metal terminal in the first direction during the joining, and among the plurality of protrusions provided at both end portions in the second direction of the pressing surface, a groove on an outer peripheral side of the protrusions provided at both end portions in the first direction of the pressing surface is deeper than a groove between the protrusions provided at a portion other than the both end portions in the first direction of the pressing surface.

* * * * *